US 6,621,433 B1

(12) United States Patent
Hertz

(10) Patent No.: US 6,621,433 B1
(45) Date of Patent: Sep. 16, 2003

(54) ADAPTIVE DYNAMIC RANGE RECEIVER FOR MRI

(75) Inventor: David Hertz, Dix Hills, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 09/887,385

(22) Filed: Jun. 22, 2001

(51) Int. Cl.[7] .............................................. H03M 1/18
(52) U.S. Cl. ....................... 341/139; 341/155; 324/309
(58) Field of Search ................................ 341/138, 139, 341/155; 324/309

(56) References Cited

U.S. PATENT DOCUMENTS

| 4,070,708 | A |   | 1/1978  | Smallcombe et al. |         |
|-----------|---|---|---------|-------------------|---------|
| 4,665,364 | A |   | 5/1987  | Hanawa            |         |
| 4,700,138 | A |   | 10/1987 | Shimazaki et al.  |         |
| 4,703,267 | A |   | 10/1987 | Maudsley          |         |
| 4,806,866 | A |   | 2/1989  | Maier             |         |
| 4,831,329 | A | * | 5/1989  | Hughes            | 324/309 |
| 4,871,966 | A |   | 10/1989 | Smith et al.      |         |
| 5,023,552 | A |   | 6/1991  | Mehlkopf et al.   |         |
| 5,093,621 | A |   | 3/1992  | Den Boef et al.   |         |
| 5,202,686 | A | * | 4/1993  | Rapp et al.       | 341/139 |
| 5,451,876 | A |   | 9/1995  | Sandford et al.   |         |
| 5,529,068 | A | * | 6/1996  | Hoenninger, III et al. | 324/309 |
| 5,653,233 | A |   | 8/1997  | Pelc et al.       |         |
| 5,739,691 | A | * | 4/1998  | Hoenninger, III   | 324/322 |
| 6,025,717 | A |   | 2/2000  | Hertz et al.      |         |
| 6,043,659 | A |   | 3/2000  | McKinnon          |         |
| 6,046,591 | A |   | 4/2000  | King et al.       |         |
| 6,333,707 | B1| * | 12/2001 | Oberhammer et al. | 341/155 |
| 6,448,770 | B1| * | 9/2002  | Liu et al.        | 324/309 |

FOREIGN PATENT DOCUMENTS

| EP | 0 380 174    | 8/1990  |
|----|--------------|---------|
| EP | 0 431 684 A1 | 6/1991  |
| JP | 62073146     | 4/1987  |
| JP | 01221153     | 9/1989  |
| JP | 02305549     | 12/1990 |
| JP | 04079937     | 3/1992  |
| JP | 6078899      | 3/1994  |

OTHER PUBLICATIONS

Porter et al., *A Sixteen Channel Multiplexing Upgrade for Single Channel Receivers*, Sep. 2001, Magnetic Resonance Imaging, vol. 19 No. 7, pp. 1009–1016.*

Frrederick et al., *A Phased Array Echoplanar Imaging System for fMRI*, Jan. 2001, Magnetic Resonance Imaging, vol. 19 No. 1, pp. 121–129.*

Robert W. Dykstra, "An NMR Preamplifier Modification Provides Increased Proton Sensitivity", Journal of Magnetic Resonance, vol. 78, pp. 574–576, 1988.

* cited by examiner

Primary Examiner—Howard L. Williams
(74) Attorney, Agent, or Firm—Brandon N. Sklar; Kaye Scholer, LLP

(57) ABSTRACT

A receiver for a resonance signal of a magnetic resonance imaging system generates a baseband signal for image processing by dividing a raw resonance signal among multiple parallel channels, each amplified at a respective gain. A digital channel selector determines, at any given moment, a lowest-distortion channel to be further processed. Amplitude and phase error compensation are handled digitally using complex multipliers, which are derived by a calibration, based on a simple Larmor oscillator, which can be done without the need for a sample and without repeating when measurement conditions are changed. One of the important benefits of the invention is that it provides for gain selection without repeated calibration steps. This is particularly important in systems that employ fast imaging techniques such as fast spin echo, where the invention can speed imaging substantially.

15 Claims, 10 Drawing Sheets

ADAPTIVE DYNAMIC RANGE RECEIVER FOR MRI

FIELD OF THE INVENTION

The present invention is directed to apparatus and methods for analog to digital conversion of signal characterized by wide dynamic range, and particularly to such apparatus and methods that are low in cost and require minimal calibration.

BACKGROUND OF THE INVENTION

Quantization noise is a type of noise that results from error in the conversion of an analog signal to a digital form by an analog-to-digital converter (ADC). Digital signals have discrete steps in amplitude, while analog signals can be smooth. So while an analog signal may rise or fall like a ramp, a digital signal rises or falls in discrete steps, like a staircase. When a smooth analog signal is transformed into a signal with steps, a certain amount of error results because portions of the analog signal between the steps must be converted to a signal that skips from one step to another rather than smoothly varying between them. This makes a smooth analog signal look like a noisy analog signal. To eliminate this type of additional noise, designers try to use ADCs with a lot of steps; the more steps, the finer the graininess caused by jumping between steps. However, there are practical reasons for using the ADC with the smallest number of steps possible. One is that using more steps can make the downstream equipment that uses the digital signal very expensive because each signal level must be encoded by a large amount of data.

The design of signal conditioning systems involving the conversion of analog signals to digital form invariably confronts the issue of quantization noise, although in most cases, it is just a routine step in the design process. But in some kinds of signal analysis systems, such as Magnetic Resonance Imaging (MRI), quantization noise is not so easily addressed. This is because of a characteristic of certain signals known as "dynamic range," which refers to how much variation the signal exhibits in its amplitude. A signal with a large dynamic range contains useful data at portions that are high in amplitude and at portions that are low in amplitude. In MRI systems, this problem is acute because useful information is contained in the signal all the way down to the point at which its amplitude approaches zero. The problem with handling such signals arises because of the large number of ADC steps required when a signal varies greatly in amplitude. Ideally, the designer wants as many steps as possible to minimize the quantization noise. However, the amount of noise in the original analog signal places a lower limit on how much a greater number of steps will ultimately increase the quality of the digital signal. It makes no sense to, add more steps to the ADC when the steps of the ADC are already much smaller than noise in the original analog signal. Trying to reduce the magnitude of a very small quantization noise added to a signal that already has a much higher noise level, is wasteful because it takes a lot of computing power to handle a digital signal with a lot of amplitude steps. Therefore, the best approach is to select an ADC whose step size (least significant bit) is smaller than the amplitude of the noise part of the original analog signal.

The problem addressed by the invention occurs when the size of the noise part of the signal is so much smaller than the peak signal that a tremendous number of steps are required in the ADC to insure the noise part of the signal is smaller than the step size. This type of analog signal, one where the noise level is much lower than the signal's peak, is called a signal with large dynamic range.

In MRI, a receiving coil measures magnetic resonance properties of a sample of material under study (e.g., a patient's body). The receiving coil outputs a resonance signal that varies greatly in amplitude in very short bursts. To obtain this signal, the sample has to be subjected to various cycles of magnetic fields and a burst of radio energy, after which, the receiving coil receives a burst of return radio energy. This is repeated many times for each image, each time using a slightly different magnetic field, called the phase-encoding gradient. The phase-encoding gradient makes each physical part of the sample radiate a slightly different signal so that a computer can determine the correspondence between a portion of the signal and the physical part of the sample.

Each of the signal bursts of return radio energy corresponds to a unique cycle corresponding to a different phase encoding gradient. These signals are stored in a matrix, with the corresponding phase encoding varying by row and time (from beginning to the end of the signal) varying by column. Then some mathematics is performed on the rows and columns to transform the rows and columns of signal data to rows and columns of an image, like the pixels of a computer monitor. To do the mathematics requires that all the signals be stored as numbers and that is where the ADC comes in.

The amplitude for each signal corresponding to a given phase encoding level can vary over a very wide range. However, that range normally varies from one phase encoding level to the next; the range tends to swell and then taper off as the phase-encoding level is varied. The signal range also varies with slice thickness, pulse repetition time, echo time, sample material size, sample material fat content, the type of receiver coil, etc., but these remain constant during a given imaging sequence. The prior art method of dealing with the range of the signal is to do a calibration procedure to determine the highest signal level likely to be encountered during the imaging sequence. Then the gain of the amplifier is set to the highest level that prevents the peak signal level from exceeding the upper limit of the ADC (called, "over-ranging") thereby squeezing as many ADC steps as possible within the amplitude range of the signal. Despite this, since the resonance signal can range over multiple orders of magnitude in a single imaging sequence, the amplification is such that the noise amplitude is still smaller than a step size, unless very expensive ADCs are used. There is also a tradeoff between resolution and speed of the ADC and price reflects this.

Another prior art approach has been to vary the gain during an imaging sequence. The gain is varied so that a low gain is used at times during which the signal amplitude is high and the high gain is used at times during which the signal amplitude is low. In principle, this insures that the quantization noise figure remains independent of the gain.

In practice, the prior art techniques applied heretofore have suffered from other sources of error and/or undue capital and operating costs, particularly in regard to the resonance signal analog processing. In U.S. Pat. No. 5,023,552, for example, the raw resonance signal from the receiving coil is applied to a variable gain amplifier to adjust the gain between successive resonance signal acquisitions so that the ADC is driven to substantially full output. The amplified resonance signal is then down-converted (a step in which a non-information-bearing part of the raw signal is filtered out of an information-bearing part) before being applied to the ADC. The digital signal is then mathematically processed to generate images. The signal's timing and amplitude are altered by these steps—called phase and gain error—and are compensated digitally, either before or after N-dimensional Fourier transform of the baseband signal. A calibration process is used to determine the settings of the analog amplifier and the compensation required to correct the phase and gain error. But this solution to the dynamic range problem has drawbacks. In prior art systems, the signal is amplified and down-converted before being applied to an ADC. Analog amplification and down-conversion at such high frequencies makes the analog hardware particularly sensitive to introducing gain and phase error. The errors must be accurately compensated by calibration. The calibration step, in which a known signal is applied to the receiver coil, must therefore be performed carefully and precisely to generate a lookup table for accurate compensation. But even with a calibration, changing gain during operation can introduce errors that are not entirely mitigated by calibration-based compensation and even though careful design and component selection can mitigate them, the hardware costs are high. Also, temperature, time, vibration, and other factors can affect the analog components such as variable amplifiers, reference frequency generators, phase-sensitive rectifiers, etc., particularly in view of the sensitivity of the image processing to phase error and the high frequencies at which the analog front end is operating. The functional shortcomings of the analog down-conversion components place limits on the quality of images that can be produced and the increase the costs of signal processing equipment. In addition, the calibration is a time-consuming nuisance that slows amortization and adds to the life-cycle costs of MRI systems.

SUMMARY OF THE INVENTION

Briefly, a receiver for a resonance signal of a magnetic resonance imaging system generates a baseband signal for image processing by dividing a raw resonance signal among multiple parallel channels, each amplified at a respective gain. A digital channel selector determines, at any given moment, a lowest-distortion channel to be further processed. Amplitude and phase error compensation are handled digitally using complex multipliers, which are derived by a calibration, based on a simple Larmor oscillator, which can be done without the need for a sample and without the need to repeat calibration when measurement conditions are changed.

The preferred embodiment of the invention addresses the drawbacks of the prior art by dividing the resonance signal among multiple channels, each with a respective gain applied to it. The amplified signal of each channel may be applied to a respective ADC whose input range corresponds to the gain of the respective channel. Down-conversion to baseband is performed digitally for each channel. Preferably, demodulation of the digitized resonance signal is performed by digital multiplication before decimation. Compensation for gain and phase distortion are performed by digitally multiplying each channel by a respective complex factor. At any given time, the channel used for imaging is selected by driving a selector switch with a range selector. The selected amplified signal is the signal with the highest signal-to-noise ratio (SNR) or the best fill rate for a corresponding ADC. The range selector may be driven by a separate measuring circuit or responsively to over-range flag signals of the ADCs.

By dividing the resonance signal among multiple channels, fixed-gain amplifiers (amplifiers with fixed components or variable-gain amplifiers whose gain is set and left undisturbed) may be employed. Also, down-conversion and all further signal processing may be performed digitally, avoiding the need for costly analog signal processing circuitry. Since range selection is automatic, there is no need to perform a calibration step when the sample (patient, patient position, section slice, etc.) is changed. The signal is automatically mapped to a channel for which the gain is optimal and changed to a different channel as soon as required. This avoids the need to determine the amplification required to map the raw signal to the full range of an ADC, as in the prior art. Calibration may be performed with a calibration signal from a built-in source for purposes of generating the table of complex multipliers. Also, while down-converting digitally requires high speed sampling of the raw signal and while high speed ADCs (e.g., 60MHz-about 12 bits) are limited in terms of dynamic range, the processing of the signal, at times when it is very large, through a channel with low gain and, at times when it is very small, through a channel with high gain, insures that quantization noise remains a small proportion of the signal at all times. Note that while down conversion is discussed above as being performed after digitizing the amplified signals, the down conversion may alternatively be performed prior to digital conversion, for example, with the use of frequency down-converters.

Other and further aspects of the present invention will become apparent during the course of the following description and by reference to the attached drawings.

BRIEF DESCRIPTION OF THE DRAWINGS

The accompanying drawings illustrate certain embodiments of the invention.

DETAILED DESCRIPTION OF THE EMBODIMENTS

Figure 1:
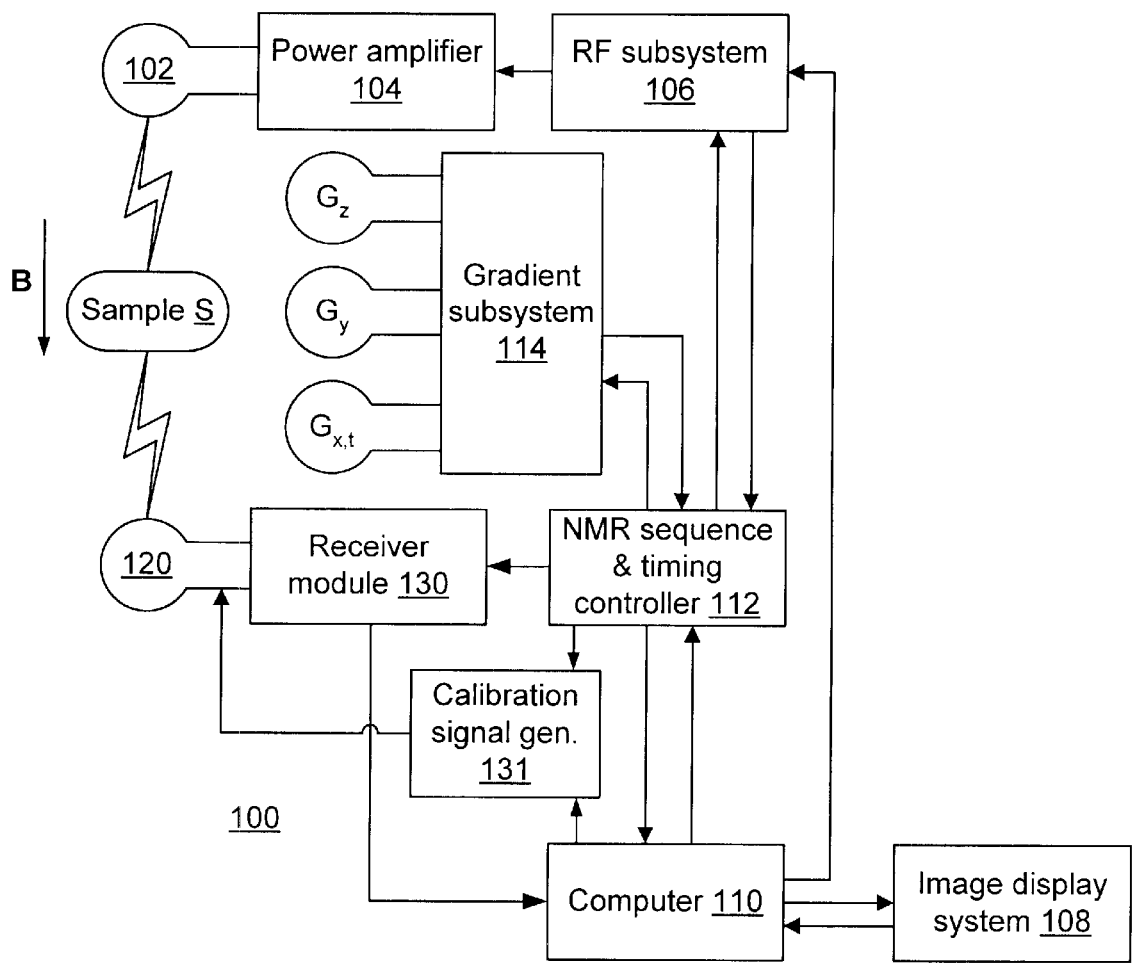
FIG. 1 is a block diagram of a magnetic resonance imaging (MRI) system according to an embodiment of the invention.

Referring to FIG. 1, a magnetic resonance imaging (MRI) system 100 has a transmitting coil 102 that injects radio frequency (RF) pulses into an imaging volume where a magnetic field B is maintained. The transmitting coil is driven by a power amplifier 104, which is in turn driven by a RF subsystem 106 under control of a computer 110 and a nuclear magnetic resonance (NMR) sequence & timing controller 112. A receiving coil 120 receives magnetic resonance (MR) signals, which are applied to a receiver module 130 for down-conversion to a baseband signal and error compensation. The resulting resonance signal is applied by the receiver module 130 to the computer 110 and image display system 108. Note that a single coil can be employed to transmit the RF signal and to receive the resonance signal. The computer 110 controls the NMR sequence & timing controller 112, which in turn controls a gradient subsystem 114 for the generation of orthogonal linear magnetic fields within the imaging volume using gradient coils Gx,t, Gy, Gz. The gradient subsystem 114 also includes a gradient waveform generator (not shown), which contains a generic waveform stored in digital form and a phase encoding waveform. The NMR sequence & timing controller 112 controls the timing of the gradient waveform generator. In response to a pulse from the NMR sequence & timing controller 112, the gradient waveform generator outputs a particular waveform for a desired imaging sequence to each of the gradient coils Gx,t, Gy, Gz. More detailed discussions of this topic are provided in U.S. Pat. Nos. 4,871,966 (Smith et. al.) and 6,025,717 (Hertz. et. al.) which are hereby incorporated by reference as if fully set forth in their entireties herein.

Broadly speaking, the receiver module 130 amplifies, digitizes, down-converts, and performs gain and phase correction of the resonance signal. Various embodiments of receiver module 130 (e.g., 130A, 130B and 130C) are shown and discussed below in further detail with reference to FIGS. 2–6. The computer 110 is a real time computer with sub-microsecond timing precision. The computer 110 controls the overall function of the MRI system 100 and may include memory (not shown in the figure) for storing data. The computer 110, in conjunction with the image display system 108, provides for the generation and display of images, such as two- and/or three-dimensional images, of an object through use of conventional mathematical techniques.

The NMR sequence & timing controller 112 is connected to the gradient subsystem 114 and RF subsystem 106 to provide RF sampling, timing, frequency and phase control. The NMR sequence & timing controller 112 may be a microprocessor-based timing controller or other programmable device that stores the timing of a MRI sequence. The NMR sequence & timing controller 112 generates a synchronization pulse, indicating the start of an imaging sequence, and timing pulses for synchronizing the components of the receiver module 130 (e.g., ADCs, down-converters, etc.), the RF subsystem 106, the gradient subsystem 114, and so forth. For instance, these pulses indicate when ADCs and down-converters of the receiver module 130 should sample the resonance signals. The NMR sequence & timing controller 112 similarly provides a series of pulses to the RF transmitter subsystem 106 for initiating the injection of radio frequency pulses into the imaging volume. The NMR sequence & timing controller 112 similarly controls operation of the gradient subsystem 114.

The NMR sequence & timing controller 112 includes a frequency generator (not shown) which provides a reference frequency to the digital down-converter 130 of the MRI system 100. The gradient subsystem 114 includes gradient coils Gx,t, Gy, Gz for producing orthogonal linear magnetic fields within the imaging volume. The gradient subsystem 114 may also include a gradient waveform generator (not shown) and a phase-encoding waveform stored digitally. In response to a pulse from the NMR sequence & timing controller 112, the gradient waveform generator outputs a particular waveform for a desired imaging sequence to each of the gradient coils Gx,t, Gy, Gz. A more detailed explanation of this process is given in U.S. Pat. No. 4,871,966, incorporated by reference above. A calibration signal generator 131 generates a calibration signal in response to commands from the computer 110 and synchronized by timing signals from the NMR sequence & timing controller 112. The calibration process is discussed below and in detail with reference to FIG. 8.

Figure 2:
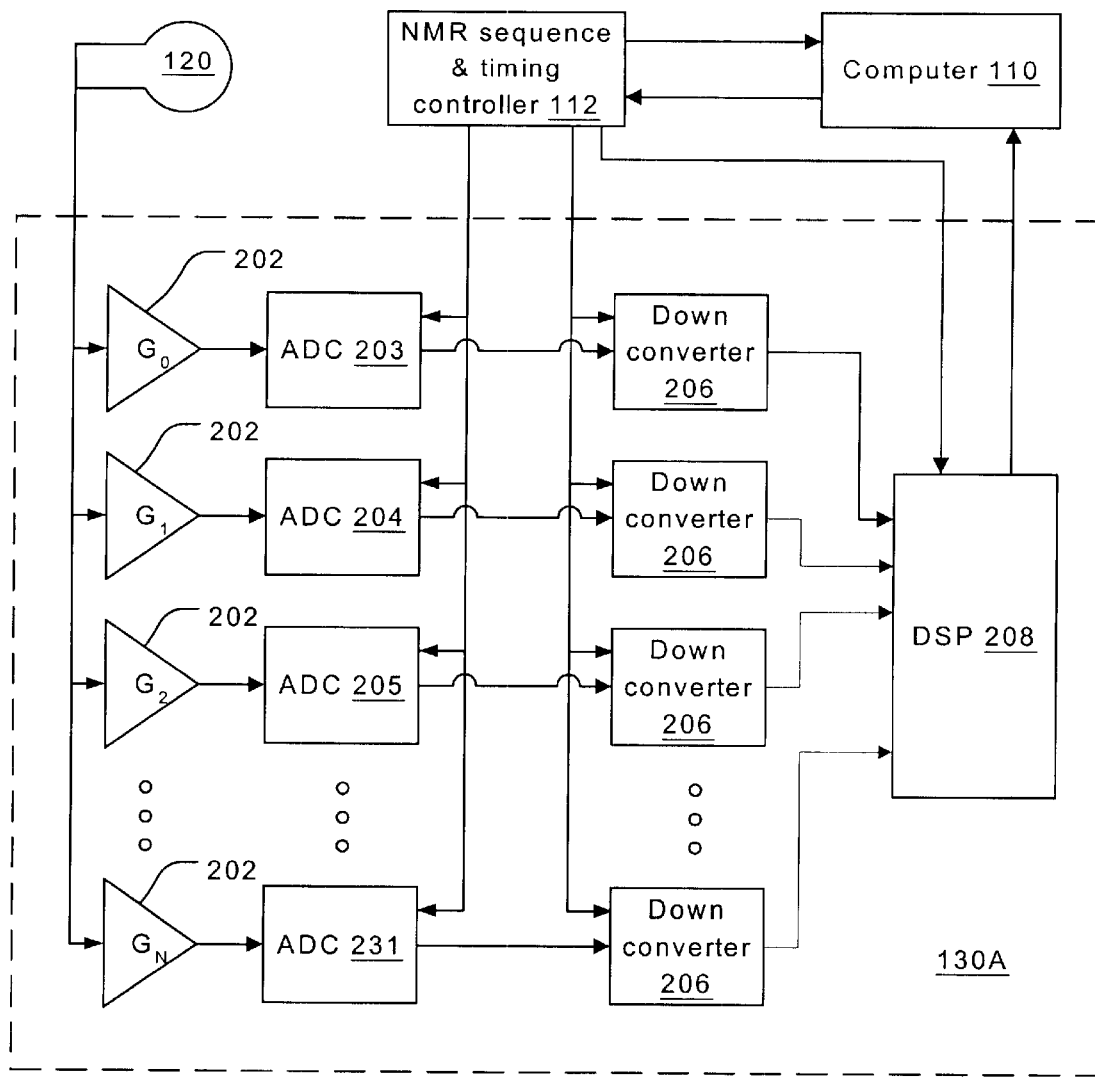
FIG. 2 is a schematic diagram of a receiver module of the MRI system of FIG. 1 according to one embodiment of the invention.

Referring to FIG. 2 a receiver module 130A, according to one embodiment of the invention, includes a plurality of amplifiers 202, arranged in parallel, for amplifying a resonance signal received from the receiving coil 120. Each amplifier provides a respective gain (G0, G1, G2, G3 . . . Gn). The amplifiers 202 can have a fixed or variable gain, but are preferably of fixed gain. Each amplified signal output by a respective amplifier 202 is applied to a respective ADC 203, 204, 205, 231, which converts the signal to a digital output which is then digitally down-converted, by a respective down-converter 206, to baseband. The ADCs 203, 204, 205, 231 may have identical or different input ranges (e.g., 12-bit, 14-bit, etc.) and may include anti-aliasing filters as required to avoid aliasing of the input signal. The down-converted signals from the digital down-converter 206 are then applied to a digital signal processing circuit (DSP) 208 configured to select the digital signal with the highest signal-to-noise ratio whose ADC 203, 204, 205, 231 is not over-saturated. Switching may be governed by comparing the signal levels to the known ranges of the ADCs 203, 204, 205, 231 or responsively to the over-range flags of the ADCs 203, 204, 205, 231. This may be accomplished by comparing the signals to each other to determine the signal that fills the ADCs 203, 204, 205, 231 with the highest dynamic range. In other words, the channel with the highest amplification that does not over-saturate its ADC 203, 204, 205, 231 is selected by the DSP 208. Still another way to describe this function is that the channel is selected which results in the lowest distortion of the analog signal by conversion to digital form.

There are at least these two kinds of distortion that can occur:

1. An analog signal with a small amplitude applied to the ADC 203, 204, 205, 231 with a large input amplitude range may have an analog noise level that is lower than the least significant bit of the ADC 204. This results in quantization noise, which is a type of distortion.
2. An analog signal, whose amplitude over-saturates the input of an ADC 204, is clipped, which is also a distortion.

3. An analog signal that has noise added to it by and following the amplifier.

So the configuration of the channel selection circuitry (or programming, depending on the type of DSP) can be tersely characterized as being one that selects the channel with the lowest distortion. Another way to perform channel switching in the embodiment of FIG. 2 is to use a lookup table to identify a channel corresponding to a current phase encoding level. The lookup table is based on a calibration as discussed below with reference to the embodiment of FIG. 3.

The signal on the selected channel is multiplied, in the DSP 208, by a complex coefficient that corrects for gain and phase distortion due to amplification and analog and digital signal conditioning to ensure uniform scale and phase alignment of the signals used for imaging. The gain and phase correction coefficients may be based on tables prepared during a calibration process that employs a fixed calibration signal, a procedure for which is discussed further below.

DSP 208 may also perform other signal/data processing, such as filtering the selected signal. For example, DSP 208 may band-limit the data to remove noise. The data may be stored along with other data for processing by the computer 110 and displayed by the image display system 108. The data may be processed to generate two- and three-dimensional images using known mathematical techniques.

Again, the NMR sequence & timing controller 112 generates timing pulses for clocking the various subsystems of the receiver module 130A, such as the ADCs 203, 204, 205, 231, digital down-converters 206 and DSP 132, thereby synchronizing the components of the receiver module 130A.

Figure 3:
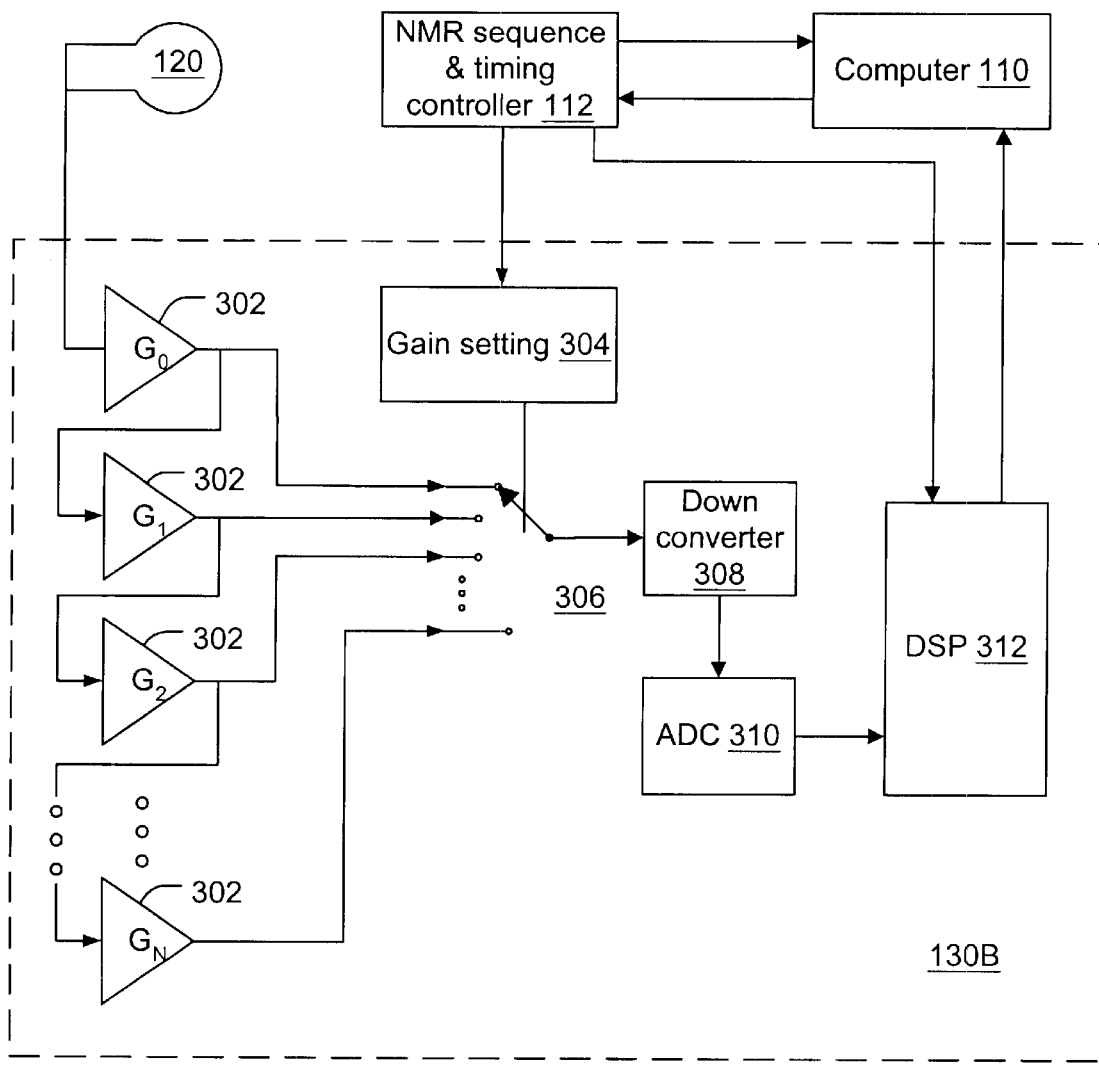
FIG. 3 is a schematic diagram of a receiver module of the MRI system of FIG. 1 according to another embodiment of the invention.

Referring to FIG. 3, a receiver module 130B in accordance with another embodiment of the invention includes a plurality of amplifiers 302, arranged in series, for amplifying, at respective gains (e.g., G0, G1G2, G0G1G2, G0G1G2G3, . . . , G0G1G2G3 . . . Gn) the resonance signal received from the receiving coil 120. As in the embodiment of FIG. 2, the amplifiers 302 can be fixed amplifiers or variable amplifiers that have been adjusted to desired gain settings. A gain setting module 304 controls a switch 306 to select an amplified signal from the plurality of amplified signals according to a gain table.

A gain table calibration procedure, which correlates the peak resonance signal amplitude with phase encoding level, should be performed each time the sample is changed or any other parameter is changed which might affect the relationship between peak resonance signal intensity and phase encoding level. Then, when each imaging sequence is performed, the gain setting module 304 can, at the beginning of each new phase encoding level, set the switch 306 to the corresponding gain to apply the gain that maps the resonance signal to the fullest possible range of the ADC 310.

During the calibration procedure, the gain ratio values in the table are predetermined for each phase encoding level prior to commencement of an imaging sequence. The resulting table will specify, for phase encoding level 1, the selection of the amplifier 302 with the highest gain that is less than the ratio SADC/SPEL,l, where SADC is the saturation signal level of the ADC 310, and SPEL,l is the maximum resonance signal level for the lth phase encoding level. The maximum signal expected at each phase encoding level, referred to as the "warp level," is a wave envelope running along a phase encoding axis (the row of the matrix mentioned above) that defines the value of the maximum signal expected for each phase encoding level. The resulting table, derived with each calibration, can be maintained in a memory accessible by the gain setting module 304 and thereafter used to select the appropriate amplifier 302.

Once an amplified signal is selected by gain setting module 304 via switch 306, the selected signal is applied to a frequency down-converter 308 that down-converts the signal to the baseband signal. The down-converted signal is then applied to an ADC 310 and the resulting digital output applied to a DSP 312. The DSP 312 normalizes, as to phase and gain, the digital signal according to the respective distortions caused by the amplification for the respective phase encoding level and down-conversion. The DSP 312 may also perform other signal processing, such as filtering the digital signal or data. The data may be stored along with other data for processing by the computer 110 and display by the image display system 108. The data may be processed to generate two- and three-dimensional images using known mathematical techniques. Again, the NMR sequence & timing controller 112 generates timing pulses for synchronizing the gain setting module 304, the ADC 310, and DSP 312.

Figure 4:
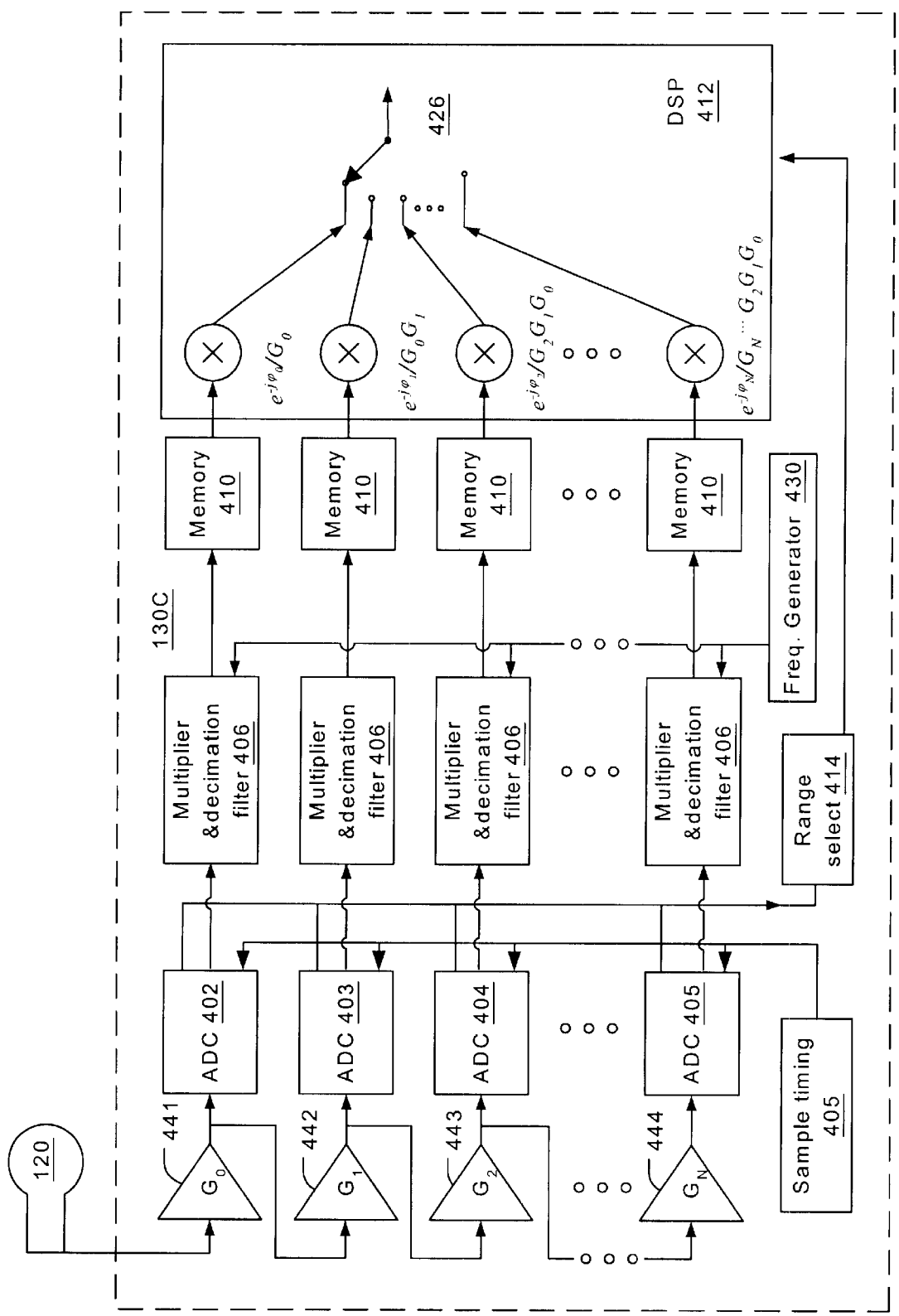
FIG. 4 is a schematic diagram of a receiver module of the MRI system of FIG. 1 according to yet another embodiment of the invention.

Referring to FIG. 4, another embodiment 130C of the receiver module 130 directly converts the resonance signal to digital form and performs down-conversion digitally as in FIG. 2. In the embodiment of FIG. 4, however, a particular method of down-conversion—by means of multiplication followed by decimation—is employed. In this embodiment, a plurality of amplifiers 441–444 are arranged in series, each amplifying the resonance signal by a respective gain (G0, G1G2, G0G1G2, G0G1G2G3, . . . , G0G1G2G3 . . . Gn). The output of each amplifier 441–444 is applied to a respective ADC 402–405 controlled by a high frequency sampling timing source 405 (i.e., a clock). Again the ADCs 402–405 can be different or identical components. The resulting digitized signals are applied to corresponding multiplier/decimation filter modules 406, which digitally down-convert the digital signal by multiplying the corresponding input signals by an output from a numerical frequency generator 430, whose output is synchronized with the rest of the receiver 130C. The output of the numerical frequency generator 430 is a sinusoidal signal at the Larmor frequency. The frequency generator 430 may be of any suitable construction, one example being a lookup table storing a sine function and clocked in synchrony with the other components of the receiver 130C. The demodulated signal may then be decimated and output. Each of decimated signals is stored in a corresponding memory 410, and thereafter, accessed in first-in first-out (FIFO) fashion and applied synchronously to DSP 412. It goes without saying that memories 410 need not be discrete components and can be portions of a single memory device. The delay registers 410 make up for the different clocking rates of the decimated signal versus the signal prior to decimation.

The DSP 412 multiples each of the signals with a complex multiplier to correct for phase distortion and gain $(1/G)e-j\phi n$ where G is the respective gain applied to the signal (e.g., G0, G1G2, G0G1G2, G0G1G2G3, . . . , or G0G1G2G3 . . . Gn); and $\phi n$ is a phase angle difference introduced by the analog amplification process respective to amplifier n. The DSP 412 thereafter selects, by way of a switch 426, one of the signals from the plurality of normalized signals according to an output of a range select module 414.

As shown, the range select module 414 receives signals from the over range-flags of the ADCs 402–404, and provides an indication to the DSP 412 of which signal has the highest SNR. The signal from the over-range flags of the ADCs 402–405 indicate when corresponding ADCs 402–405 are over-saturated. That is, the best SNR will be provided by the channel with the highest amplification whose ADC 402–405 is not over-saturated (with due consideration for any lag required to provide a sufficient number of samples for demodulation as discussed below with reference to FIGS. 5 and 6).

At any given moment, the range select module 414 provides a logic signal whose output indicates which channel should be used. The signal could be provided by various different mechanisms, one being control logic that climbs the channels in the direction of highest gain to lowest gain, skipping all channels whose ADCs 441–444 are over-saturated. Those channels whose ADCs 402–405 are over-saturated are producing data that is unusable.

The switching is fast enough that it can be performed in real-time, since the data are relatively slow-moving compared to digital processor speeds, the former being only in the kilohertz range. Thus, the matching of signal dynamic range to ADC 402–405 can always be as good as the resolution provided by the intervals between the different gain factors. However, the switching of channels is constrained by the fact that the demodulation process may require a minimum number of samples (for low pass filtering). This constraint is discussed below.

Providing more channels, each with smaller respective differences in gain, allows the mapping of signal strength variation to better track the ADC range than providing fewer channels with greater respective differences in gain. Note that channel selection by switch 426 can be accomplished in various ways. A set of analog window-detectors (each using a pair of comparators with different threshold limits) could be used for this purpose. Alternatively, a single ADC, to which the entire resonance signal is mapped, can be configured to compare its output to numerical upper and lower bounds (windows) for each channel and appropriate logic used to drive the selection. The entire DSP 412 can be created in various ways, including an application-specific integrated circuit (ASIC) and in software, using a programmable embedded system.

The DSP 412 may also perform other signal processing, such as filtering the digital signal. The data may be stored along with other data for processing by the computer 110 and display by the image display system 108. The data may be processed to generate a two dimensional image, or a three dimensional image, using known mathematical techniques. Again, the NMR sequence & timing controller 112 provides timing pulses to synchronize the subsystems of the receiver module 130C.

The above embodiments of the receiver 103 can be calibrated once for many imaging sequences, even when the sample is changed between imaging sequences. This is because the amplifier gain is not changed in any of these embodiments. As a result, the phase- and gain-normalization coefficients are fixed, and, once determined by calibration, need not be measured over and over unless significant changes to the magnetic field intensity are made, which would affect the Larmor frequency. The receiver can therefore be equipped with an oscillator (not shown) for generating a Larmor frequency, which can be switched into the receiver coil 120 circuit for calibration.

The coefficients for gain and phase correction may be derived in various ways. For example, the gain correction can be obtained by precisely measuring the gain of the amplifiers 202, 302, 441–444 and generating a lookup table correlating the gain ratio and the channel. The phase correction parts of the complex correction coefficients can be obtained by generating a test signal and measuring the phase differences between the signals on each channel. This could also be done with an actual NMR signal during a short calibration process. The latter would capture a sample signal in a memory and search for a peak in the mutual correlation function with respect to one of the channels.

Figure 5:
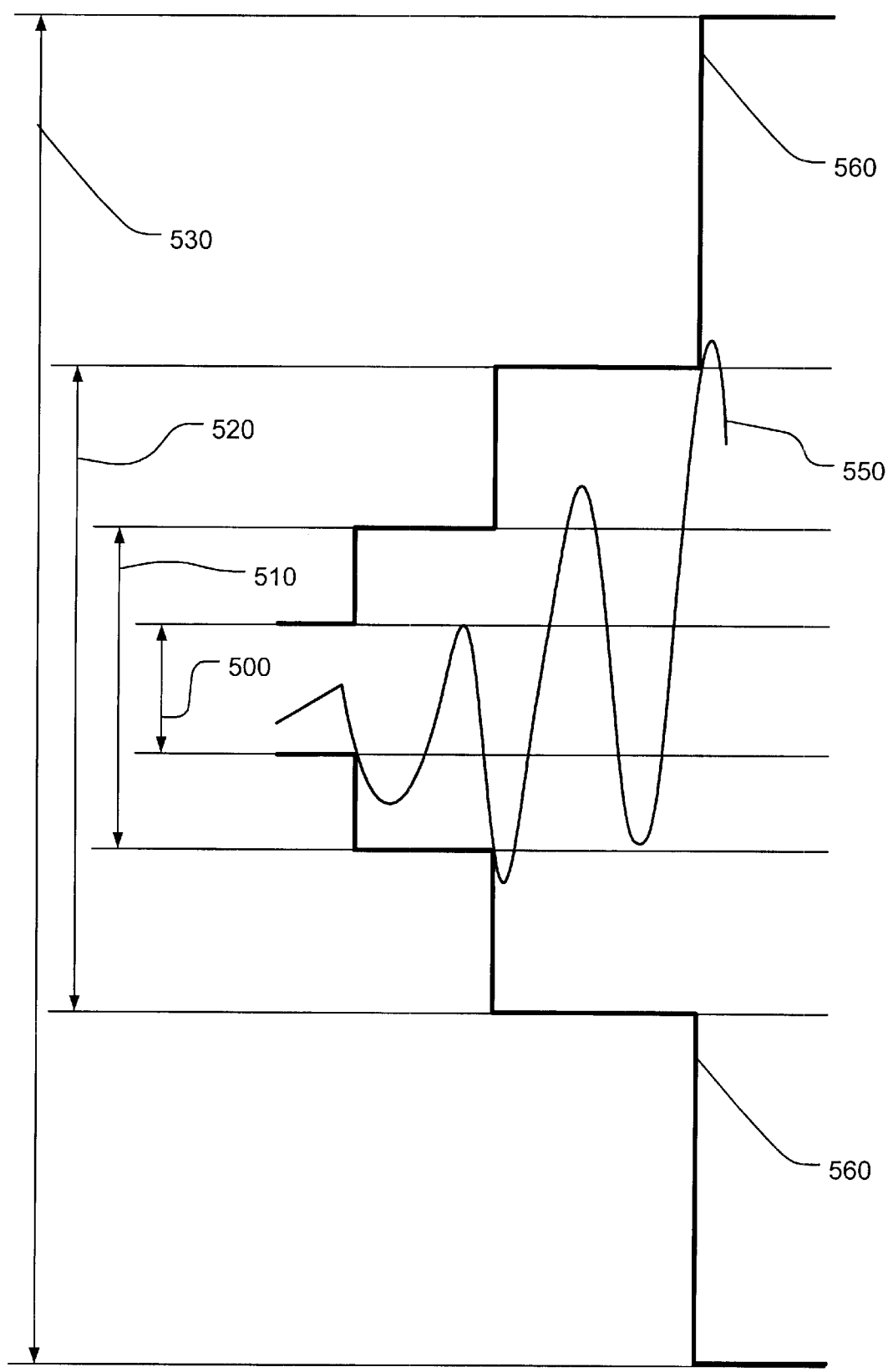
FIG. 5 is a figurative illustration of a portion of a resonance signal versus time, or a portion of a resonance signal envelope varying with phase encoding level, mapped against amplitude ranges for the signal conditioning channels consistent the embodiments of FIGS. 2–4.

Referring to FIG. 5, a portion of a resonance signal, indicated by the curve 550, is illustrated in relation to four amplification ranges, each corresponding to one of the channels of the receiver 130A–130C embodiments of FIGS. 2, 3, and 4. The highest gain channel corresponds to the amplitude range designated by 500. The second-to-highest gain corresponds to the range designated by 510, and so forth for ranges 520 and 530, the range 530 corresponding to the range of resonance signal amplitude that can be applied to the lowest gain amplifier without over-saturating. Continuous lines 560 indicate the currently selected range for the highest gain channel whose ADC is not over-saturated.

Note that the curve 550 can also represent, in FIG. 5, the peak amplitude envelope of the resonance signal as it varies with phase encoding level. In other words, the same curve can represent either orthogonal view in K-space. According to this interpretation, the selected channel 510–530 is based on the peak amplitude for a given phase encoding level and not in real time. To permit this, as discussed elsewhere in the present specification, a calibration run to obtain the peak amplitudes for each phase encoding level may be performed and the channel selected according to a lookup table resulting from that calibration procedure.

Figure 6A:
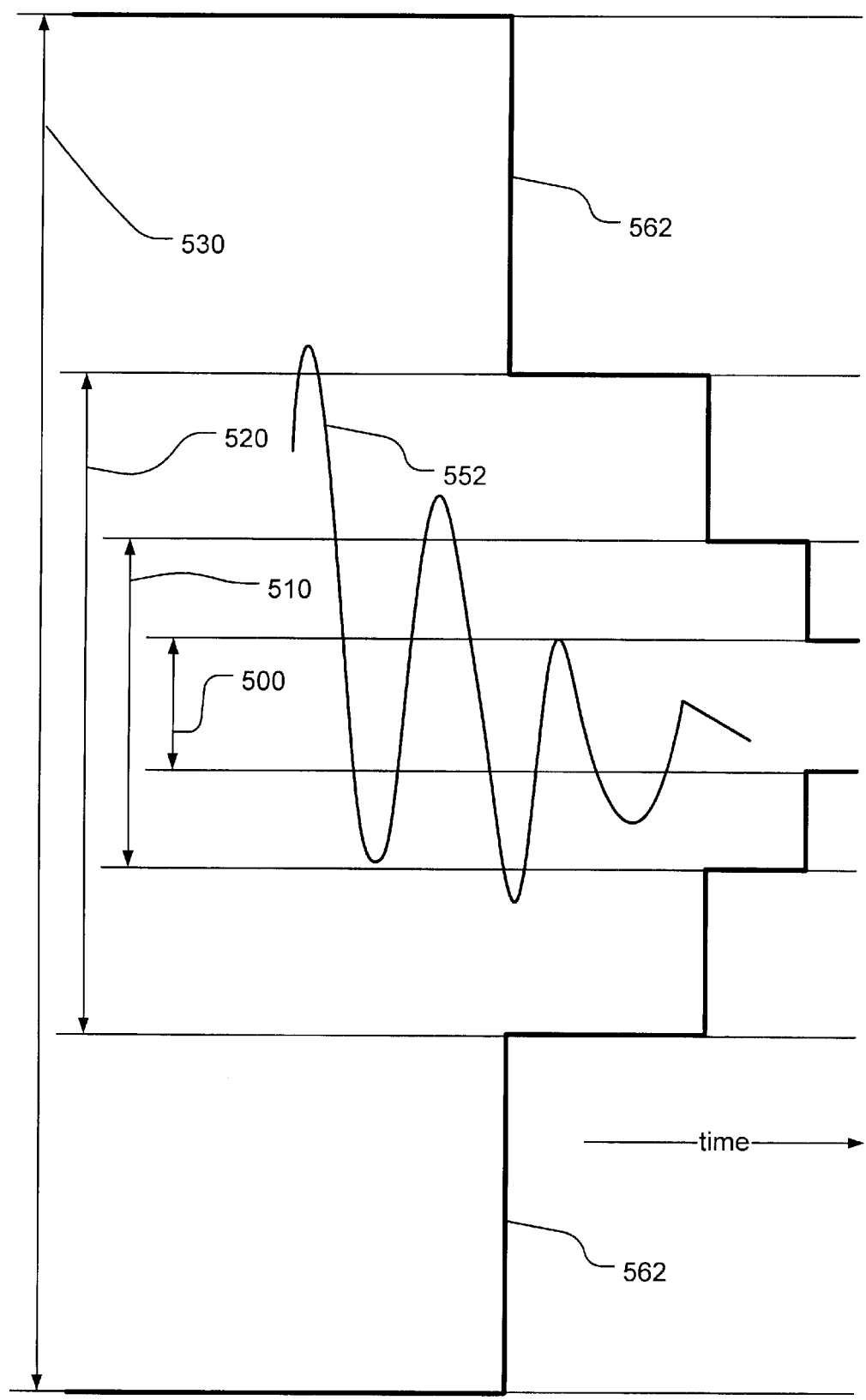
FIG. 6A is a figurative illustration of another portion of a resonance signal versus time mapped against amplitude ranges for the 25 signal conditioning channels consistent the embodiments of FIGS. 2–4.
Figure 7:
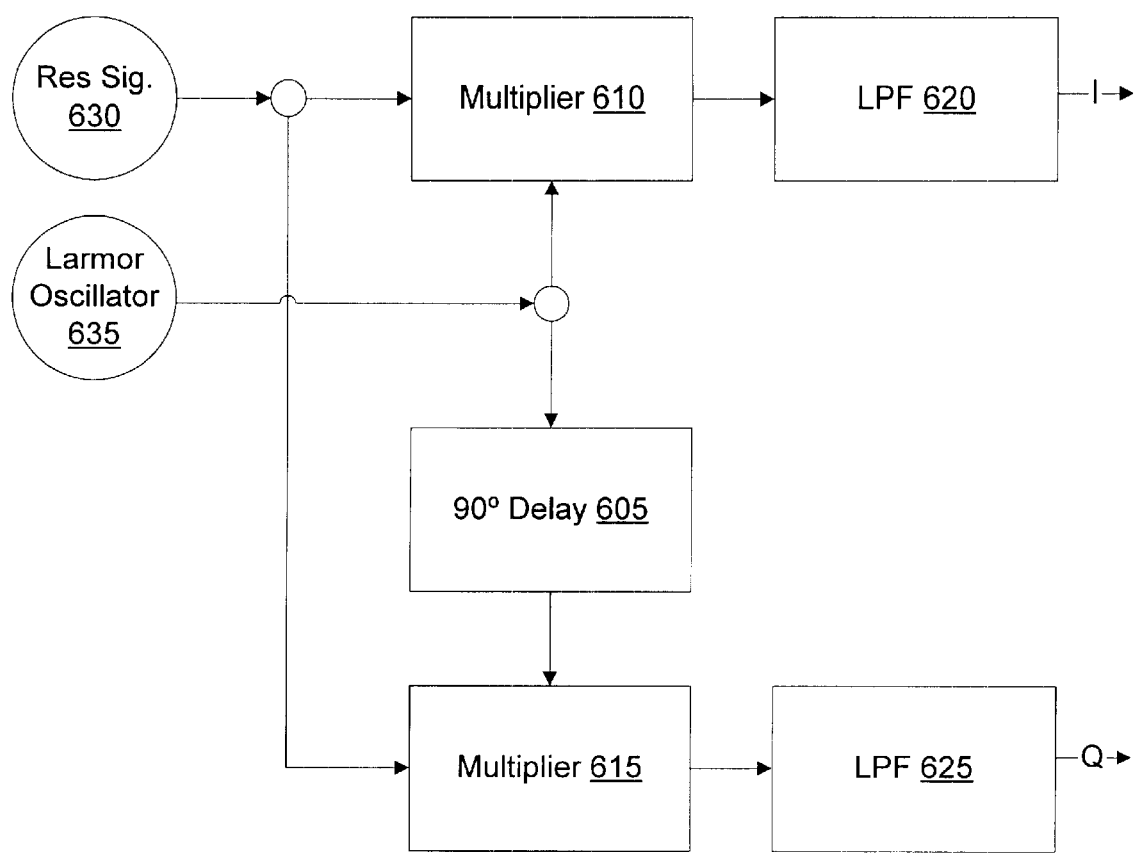
FIG. 7 is an illustration of an I–Q demodulator for digitally down-converting a resonance signal according to an embodiment of the invention.

Referring now to FIG. 6A, where the curve 552 now represents the time-varying resonance signal for a given phase encoding level, note that the lines 562 do not indicate that the currently selected range falls back to a higher gain channel immediately after the signal 552 drops below the saturation level of the next higher gain channel. Rather, a delay (or minimum number of samples) is required before switching to a higher gain channel. Referring momentarily also to FIG. 7, demodulation requires a minimum interval of time (or number of samples) after the raw signal falls below the level at which the next higher-gain channel's ADC is over-saturated in order for that component to begin demodulating again. The modulated signal is applied to a pair of multipliers 610 and 615, which multiply a reference signal from a Larmor oscillator 635 with the resonance signal. One of the multipliers 610 is an inline (I)-component multiplier 610 to which the reference signal is applied without phase rotation. The other is a quadrature (Q)-component multiplier 615 to which the reference signal is applied with 90° phase rotation. Low pass filters (LPFs) 620 and 625 remove the high frequency components of the I- and Q-component products yielding only the I- and Q-component components of the baseband signal. Because of the need to filter out the high frequency products using the LPFs 620 and 625, some minimum number of samples (or length of time for analog down-conversion) is required after a higher gain channel stops being clipped. In a digital signal, the extra samples required for low pass filtering are those falling under the convolution kernel defining the low pass (band pass) filter 620, 625.

As discussed, control of the currently-selected channel cannot be governed solely by the criterion of highest gain without clipping and must take into account a minimum interval after a channel's signal stopped being clipped by saturation of the ADC to begin providing a demodulated signal. Moving from a high gain channel to a lower gain channel does not require any lag since the lower gain channel is not clipped during the time the higher gain channel was selected. Referring to FIG. 6A, as the raw signal 552 amplitude drops, the selected channel moves to higher and higher gain, again with appropriate consideration given to the need for an adequate number of samples to be processed in the down-conversion process. Note that for analog down-conversion (FIG. 3: down-converter 308), the issue is not the, number of samples, but an interval of time, since the down-converter 308 is operating on an analog signal. The step of low pass filtering would be followed by decimation, which is not illustrated.

Figure 6B:
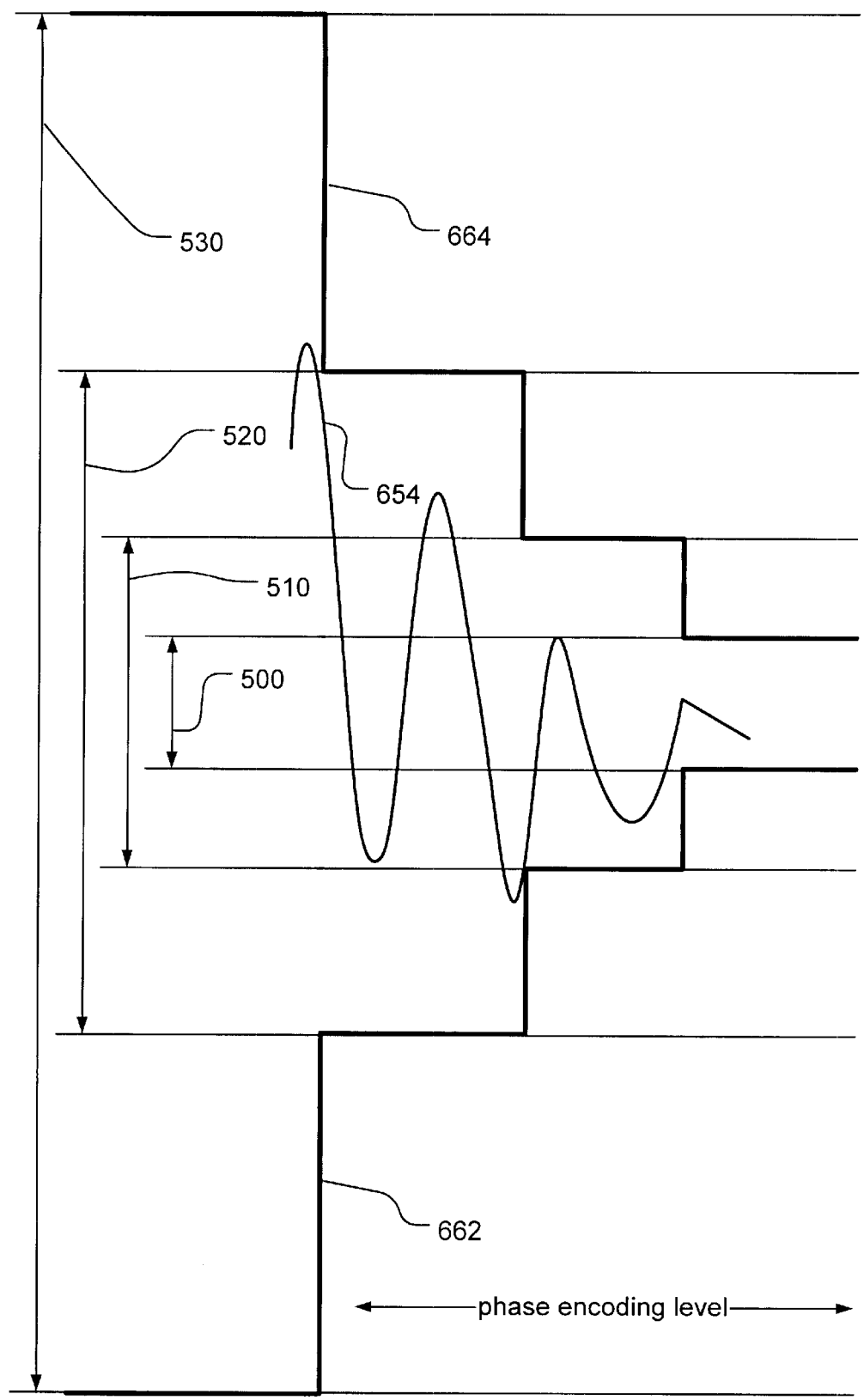
FIG. 6B is a figurative illustration of another portion of a resonance signal envelope varying with phase encoding level, mapped against amplitude ranges for the signal conditioning channels consistent the embodiments of FIGS. 2–4.

Referring now to FIG. 6B, the peak resonance signal envelope 654 is shown varying with phase encoding level. Here, the concern about convolution is not present, since the figure represents peak amplitude versus phase encoding level. Thus the channel selected can be based on the peak amplitude without any "delay" interval as illustrated in FIG. 6A. Note that in any of the embodiments, it is also possible, with sufficiently accurate phase alignment of the reference signal with the modulated signal, to accomplish the down-conversion without convolution by sampling the modulated signal at the same phase angle of the carrier. In practice, this is an unreliable method and multiplication is preferred. However, it permits the switching from low gain to high gain more quickly than illustrated in FIGS. 5 and 6 since a narrow convolution kernel (or no convolution) may be used.

As discussed above with reference to the embodiment of FIG. 3, the channel may be selected and fixed in a lookup table for a given phase encoding level, in which case no switching of channels would occur in the situation illustrated in FIG. 5. One of the channels would be selected depending on the peak amplitude for the particular phase encoding level. Rather, the signal illustrated would require that that the lowest gain channel, indicated by range 530, would be used for the whole signal corresponding to a single phase encoding level.

Figure 8:
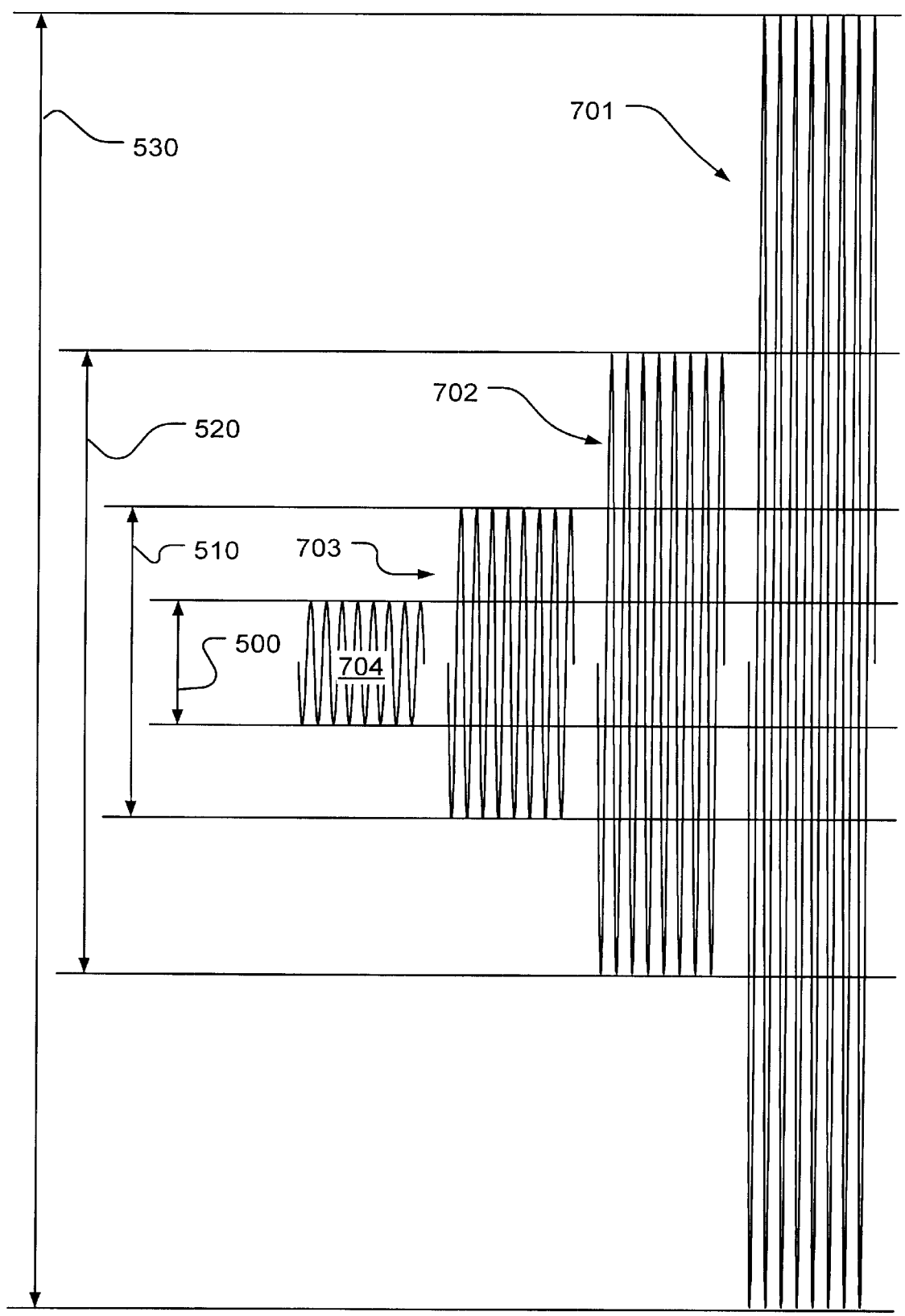
FIG. 8 is an illustration of a set of calibration signals for purposes of describing a calibration procedure according to an embodiment of the invention.

Referring now to FIG. 8, the calibration of some embodiments of the invention, for example as illustrated in FIGS. 2 or 4, involves applying a resonance signal, preferably at the Larmor frequency, to the analog input of the receiver module 130. The purpose of the calibration is to derive the gain and phase correction factors to be applied to the respective digital signals for each channel such that they are all gain-and phase-normalized. The samples output by the DSP 412 must all represent the same signal magnitude and must all be temporally synchronized such that at any moment, every sample represents the resonance signal at the same phase angle (except for the fact that some channels may be overdriven) and indicates the same magnitude.

The calibration procedure begins by transmitting a first signal 704 whose amplitude is at the highest level that does not overdrive the highest gain channel 500. This signal will simultaneously be available on all the other channels, since their gains are lower. A gain correction and a phase correction may be calculated for the next lower-gain channel relative to the highest-gain channel. Next, the calibration signal amplitude is increased until it nearly saturates (or saturates) the second-highest-gain channel. The signal would then over-range the first channel, but would still be readable by the third-highest-gain channel. The gain and phase correction for the third-highest-gain channel may then be calculated. This continues until a correction for each channel, relative to its respective next-lowest-gain channel, is obtained.

Figure 9:
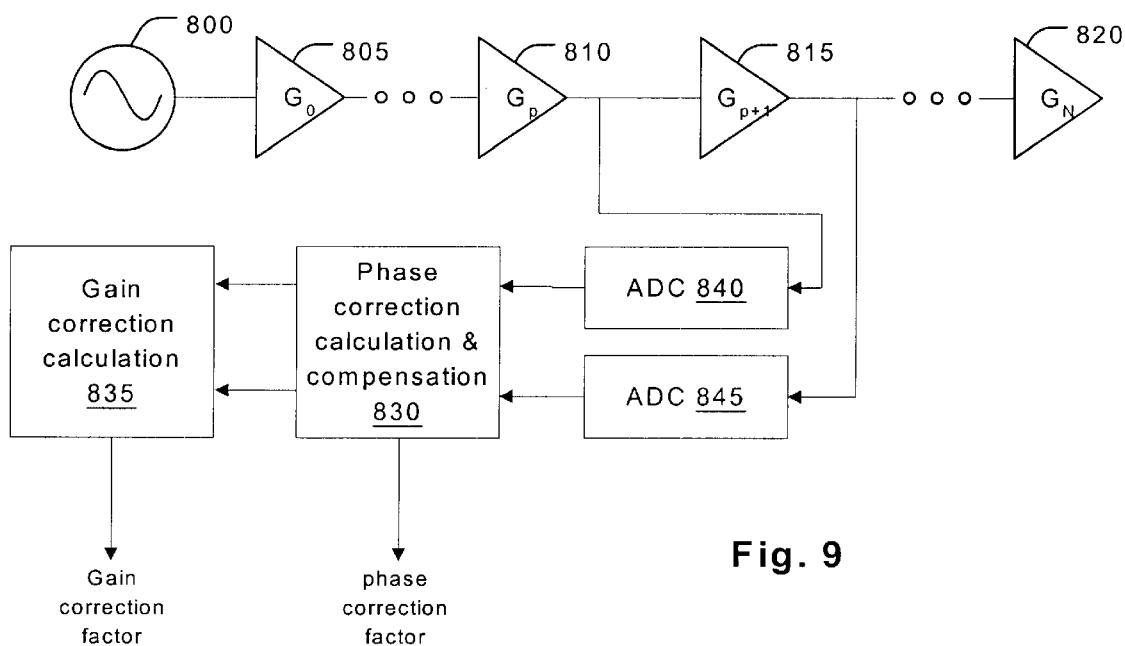
FIG. 9 is an illustration of a receiver for purposes of discussing a calibration process according to an embodiment of the invention according to an embodiment of the invention.
Figure 10:
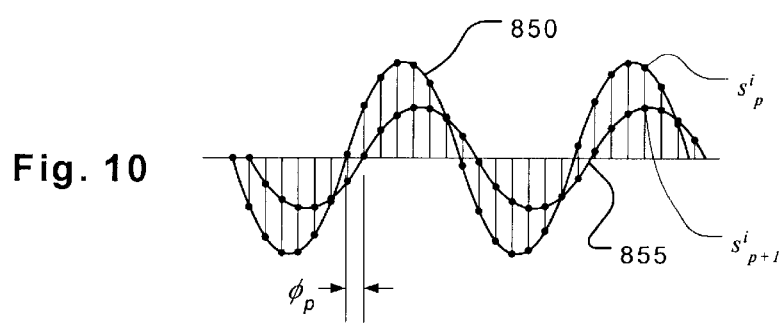
FIG. 10 is an illustration of a sample sequence of an analog signal prior to phase correction of the signal.

Referring now to FIG. 9, the calibration signal is applied to amplifiers 805–820, which may corresponds to the amplifiers 302 of the embodiment of FIGS. 3 or the amplifiers 441–444 of FIG. 4. Signals of different (preferably adjacent in magnitude, but not necessarily) amplification levels are applied to respective ADCs 840 and 845 as described above for the calibration procedure. The signals output by the ADCs 840 and 845 are illustrated in FIG. 10. Here, a phase difference p between the signals from the two ADCs 840 and 845 is illustrated with interpolation curves 855 and 850, respectively, joining the ADC samples. As can be seen in the illustration, the signals have identical frequencies, but differ in terms of phase and magnitude.

Figure 11:
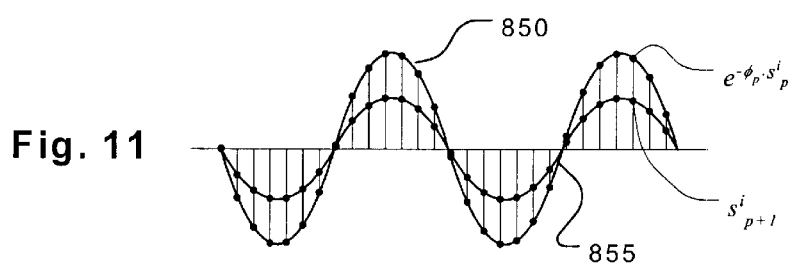
FIG. 11 is an illustration of the sample sequence of FIG. 10 after phase correction of the signal according to an embodiment of the invention.

The respective samples, not yet corrected for phase mismatch, are applied to a phase correction calculation and compensation process 830 which receives a large number of samples to cumulate an accurate determination of the phase difference. This can be done by averaging the differences between the zero crossing determined by interpolation, but a preferred method of doing it is to perform a complex FFT on the samples and then average the phase difference over a sufficient number of iterations to reduce the error to a desired level. The phase correction calculation and compensation process 830 calculates correction factors and applies them to the signals. FIG. 11 illustrates the signals with a correction applied to the higher gain signal to align it with the lower gain signal. Of course, since all the signals from all the channels are ultimately to be aligned and ordinarily a correction factor would have to be applied to every signal, except possibly one selected represent a reference phase angle.

The gain correction is obtained from the phase-corrected signals by averaging the magnitude ratios for a large number of samples. That is, the gain Gp of channel p relative to channel p+1 is the ratio of the sums of the absolute values of the samples sip over many samples:

$$G_p = \frac{1}{M} \frac{\sum_{i=1}^{M} |s_{p+1}^i|}{\sum_{i=1}^{M} |s_p^i|}$$

where sip is the sample i of channel p.

The above calibration procedure can provide highly accurate phase and gain corrections by using averaging to reduce the effect of random error. The noise factor in each resonance signal during imaging, as discussed above, remains no matter how precise the calibration. As discussed above, the noise in the analog signal and injected during analog processing (including conversion to digital) and the quantization error (quantization error) are two principal sources. An embodiment of the invention, by varying the effective gain at which the signal is converted to digital form, reduces the quantization error by $\log_2(c+1)$ bits for each channel added, where c is the number of channels and assuming that we start with one and each adjacent channel is higher than the next lower gain channel by a factor of 2. The effect is to make it easier to satisfy the requirement that the unavoidable input noise will be below the least significant bit of the ADC to avoid appreciable quantization noise.

It will be apparent to those skilled in the art that various modifications and variations can be made in the system and processes of the present invention without departing from the spirit or scope of the invention. Thus, it is intended that the present invention covers the modifications and variations of this invention provided they come within the scope of the appended claims and their equivalents. In this context, equivalent means each and every implementation for carrying out the functions recited in the claims, even if not explicitly described herein.

What is claimed is:

1. A device for converting an analog signal to a digital signal, comprising:

a plurality of signal channels each having a respective amplifier with a respective gain, analog-to-digital converter (ADC), and digital down-converter interconnected such that a respectively amplified, digitized, and down-converted digital signal responsive to a common analog signal is generated;

a digital signal processor (DSP) connected to receive said digital signals and configured to select a one of said digital signals having a lowest distortion; and said DSP being further configured to correct for lack of phase coherence and differing gain in said digital signals respective to each of said channels, whereby said one of said digital signals remains normalized with respect to others of said digital signals when said others are selected.

2. A device as in claim 1, wherein at least some of said ADCs have respective overflow flags and said DSP is further configured such that it selects said one of said digital signals responsively to said overflow flags.

3. A device as in claim 2, wherein said analog signal is a resonance signal of a magnetic resonance imaging system.

4. A device as in claim 1, wherein said analog signal is a resonance signal of a magnetic resonance imaging system.

5. A device as in claim 1, wherein said DSP is further configured such that said one of said digital signals is the one corresponding to the one of said respective amplifiers with the highest of said respective gains that does not over-saturate an input of its respective ADC.

6. A device as in claim 1, wherein each digital down-converter comprises a multiplier.

7. A device as in claim 6, wherein each digital down-converter further comprises a decimator to decimate an output of the multiplier.

8. A receiver for a magnetic resonance imaging device, comprising:

amplifiers with respective gain factors and inputs connectable to a resonance signal source and respective outputs;

a respective analog-to-digital converter (ADC) connected to said respective output of each of said amplifiers, each said ADC generating a respective digital output;

a respective multiplication/decimation filter connected to each ADC to receive said respective digital output, each multiplication/decimation filter being configured to extract a respective baseband signal from a respective one of said digital outputs to generate a respective baseband output;

each of said respective multiplication/decimation filters being configured to demodulate a respective one of said digital outputs by numerically multiplying it by a signal from a numerical frequency generator; and a digital signal processor configured to select a one of said respective baseband outputs for output to an imaging system such that quantization noise in said digital output is a minimum fraction of said digital output and such that the ADC corresponding to said one of said digital outputs is not over-ranged thereby.

9. A method of digitizing an analog signal, comprising:

receiving the analog signal along a plurality of channels;

amplifying the signal along each channel with a respective gain;

converting each amplified signal into a digital signal, to provide a plurality of digital signals;

down-converting each of the plurality of digital signals to provide a plurality of down-converted digital signals;

selecting a one of the down-converted digital signals having a lowest distortion; and correcting for lack of phase coherence and differing gain in said down-converted digital signals respective to each of said channels, whereby one of said digital signals remains normalized with respect to others of said digital signals when said others are selected.

10. A method as in claim 9, wherein each analog signal is converted to a digital signal by respective analog-to-digital converters (ADCs).

11. A method as in claim 10, wherein at least some of the respective ADCs have respective overflow flags, the method comprising:

selecting the one of the down-converted digital signals in response to said overflow flags.

12. A method as in claim 10, wherein each signal is amplified along each channel by a respective amplifier with a respective gain, the method comprising:

selecting the digital signal corresponding to a respective amplifier with the highest respective gain that does not over-saturate an input of its respective ADC.

13. A method as in claim 9, wherein the analog signal is a magnetic resonance signal, the method comprising:

receiving the magnetic resonance signal along the plurality of channels.

14. A method as in claim 9, comprising down-converting each of the plurality of digital signals by:

numerically multiplying each of the plurality of digital signals by an output from a numerical frequency generator.

15. A method as in claim 14, further comprising decimating each of the plurality of numerically multiplied digital signals.

* * * * *